(12) United States Patent
Cheah et al.

(10) Patent No.: US 7,804,131 B2
(45) Date of Patent: Sep. 28, 2010

(54) MULTI-CHIP MODULE

(75) Inventors: Chuan Cheah, Redondo Beach, CA (US); Kunzhong Hu, Santa Monica, CA (US)

(73) Assignee: International Rectifier Corporation, El Segundo, CA (US)

( * ) Notice: Subject to any disclaimer, the term of this patent is extended or adjusted under 35 U.S.C. 154(b) by 727 days.

(21) Appl. No.: 11/796,771

(22) Filed: Apr. 30, 2007

(65) Prior Publication Data
US 2008/0048342 A1 Feb. 28, 2008

Related U.S. Application Data

(60) Provisional application No. 60/796,288, filed on Apr. 28, 2006.

(51) Int. Cl.
*H01L 29/78* (2006.01)
(52) U.S. Cl. ............... 257/341; 257/E29.257; 257/401; 257/500; 257/706
(58) Field of Classification Search .......... 257/E25.027, 257/E29.257, E21.38, E21.418, 777, 706, 257/707, 712, 723, 696, 676, 692, 341, 401, 257/500
See application file for complete search history.

(56) References Cited

U.S. PATENT DOCUMENTS

| | | | | |
|---|---|---|---|---|
| 6,777,800 B2* | 8/2004 | Madrid et al. | ............... | 257/690 |
| 6,946,740 B2* | 9/2005 | Schaffer | ............... | 257/777 |
| 6,992,386 B2* | 1/2006 | Hata et al. | ............... | 257/735 |
| 7,071,550 B2* | 7/2006 | Sato | ............... | 257/706 |
| 7,166,496 B1* | 1/2007 | Lopez et al. | ............... | 438/110 |
| 7,220,617 B2* | 5/2007 | Kagii et al. | ............... | 438/106 |
| 7,235,877 B2* | 6/2007 | Pavier | ............... | 257/708 |
| 7,256,501 B2* | 8/2007 | Okamoto et al. | ............... | 257/772 |
| 7,271,470 B1* | 9/2007 | Otremba | ............... | 257/666 |
| 7,301,235 B2* | 11/2007 | Schaffer et al. | ............... | 257/724 |
| 7,304,372 B2* | 12/2007 | Hu et al. | ............... | 257/678 |
| 7,615,854 B2* | 11/2009 | Montgomery | ............... | 257/678 |
| 7,671,462 B2* | 3/2010 | Sakamoto et al. | ............... | 257/691 |
| 7,683,464 B2* | 3/2010 | Sun et al. | ............... | 257/666 |
| 7,687,902 B2* | 3/2010 | Shiraishi et al. | ............... | 257/723 |
| 7,705,436 B2* | 4/2010 | Mahler et al. | ............... | 257/676 |
| 7,705,470 B2* | 4/2010 | Otremba | ............... | 257/778 |

* cited by examiner

*Primary Examiner*—Chris Chu
(74) *Attorney, Agent, or Firm*—Farjami & Farjami LLP (57) ABSTRACT

A multi-chip module that includes a conductive element connecting at least two semiconductor devices, the conductive element including enhancements for improving the mechanical coupling between the conductive element and the molded housing of the MCM.

20 Claims, 11 Drawing Sheets

MULTI-CHIP MODULE

RELATED APPLICATION

This application is based on and claims priority to the U.S. Provisional Application Ser. No. 60/796,288, filed on Apr. 28, 2006, entitled Metal Connector Locking Mechanism in SIP-MLP (MCM-MLP or MCM-QFN) Packaging, to which a claim of priority is hereby made and the disclosure of which is incorporated by reference.

BACKGROUND OF THE INVENTION

Multichip Modules (MCMs) are well known. A typical MCM includes a plurality of diverse elements disposed on one or more substrates enclosed within a molded housing. The diverse elements form an electronic circuit for, for example, driving a motor. Such circuits often include power semiconductor devices which may be connected to one another in a variety of ways.

A conventional circuit arrangement for driving a motor is known as a half-bridge. A half-bridge arrangement includes two power semiconductor devices connected in series. A typical power semiconductor device used in a half-bridge arrangement is a MOSFET, although other power semiconductor devices may also be used.

Figure 1:
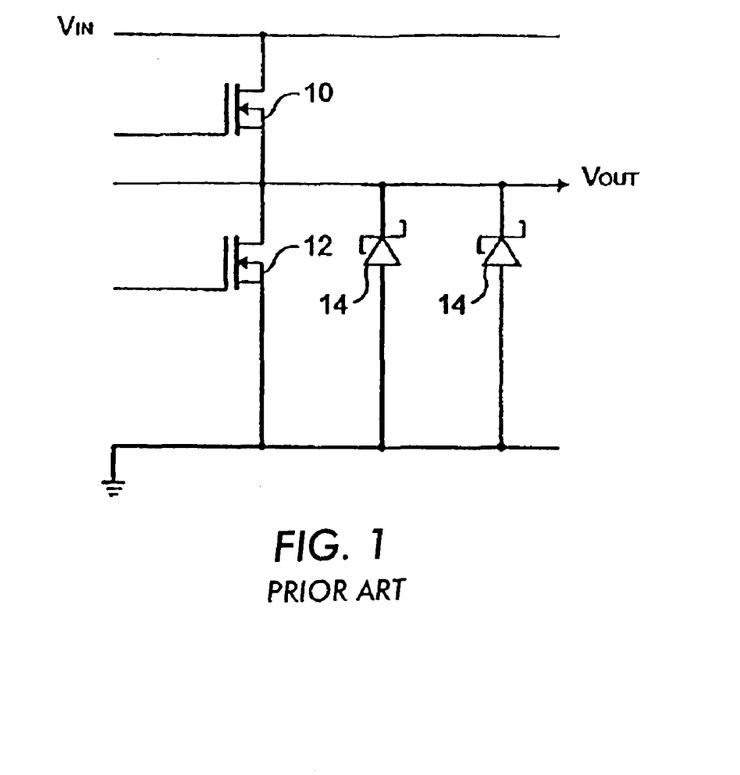
FIG. 1 shows a circuit configuration for a half-bridge circuit according to prior art.

FIG. 1 shows a half-bridge arrangement using a pair of series-connected MOSFETs 10, 12. As shown in FIG. 1, the source electrode of MOSFET 10 is electrically connected to the drain electrode of MOSFET 12. In this configuration, input voltage Vin is connected to the drain electrode of MOSFET 10 while the source electrode of MOSFET 12 is grounded. The output voltage Vout is tapped at the connection node of MOSFET 10 and MOSFET 12. Typically, one or more schottky diodes 14 are connected in parallel with MOSFET 12 between the output node Vout and ground to minimize losses during dead time conduction period.

Figure 2:
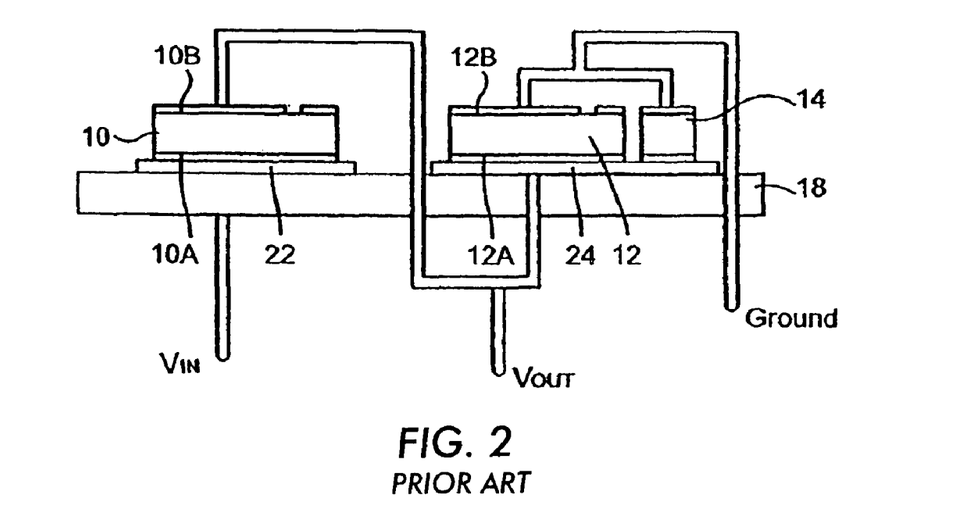
FIG. 2 shows a half-bridge configuration as used in a conventional MCM according to the prior art.

Half-bridge arrangements are vastly used in power supply devices. FIG. 2 schematically illustrates a conventional half-bridge arrangement in an MCM. Referring to these figures, according to a conventional arrangement, MOSFETs 10, 12 are disposed on a common circuit board 18. The circuit board 18 may be thermally conductive so that heat generated by the MOSFETs during operation may be transmitted to a heatsink (not shown) which may be placed in thermal contact with the circuit board 18. A suitable circuit board 18 may be an insulated metal substrate (IMS). As shown in FIG. 2, the drain electrode 10A, 12A, of each MOSFET 10, 12 is electrically connected to a respective conductive pad 22, 24 on substrate 18. To complete a half-bridge, source electrode 10B of MOSFET 10 is electrically connected to drain electrode 12A of MOSFET 12 through, for example a router, source electrode 12B of MOSFET 12 is connected to ground and drain electrode 10A of MOSFET 10 is connected to a voltage source as shown schematically in FIG. 2. Optionally, as shown in FIG. 2, a schottky diode 14 may be connected across drain electrode 12A and source electrode 12B of MOSFET 12 as is well known in the art.

Figure 3:
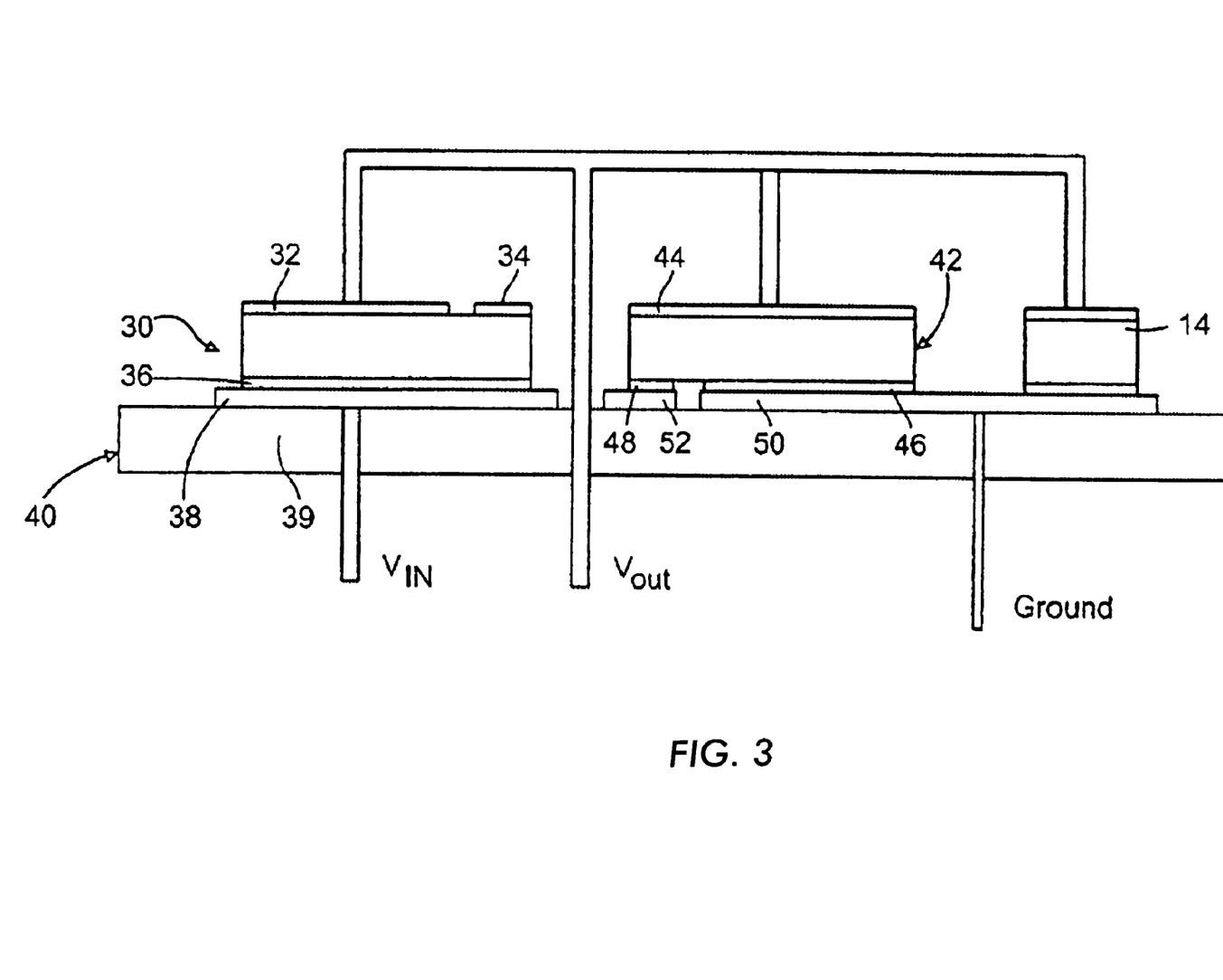
FIG. 3 shows an MCM according to a known configuration.

Referring first to FIG. 3, another known MCM (disclosed in U.S. Pat. No. 6,946,740) includes a half-bridge circuit which is implemented by a pair of series connected power semiconductor devices one of which is a conventional device and the other one a flip-chip. The first one of the power semiconductor devices is a conventional vertical conduction power MOSFET 30 which has disposed on a first major surface thereof source contact 32 and gate contact 34, and on the opposing second major surface thereof drain contact 36. Drain contact 36 of power MOSFET 30 is electrically connected to conductive pad 38, by, for example, a layer of solder, or conductive epoxy. Conductive pad 38 is part of a printed circuit board 40. Printed circuit board 40 may be an insulated metal substrate (IMS), an organic laminate substrate, or direct-bonded copper (DBC) which includes a thermally conductive, but electrically insulative substrate 39 on which conductive pad 38 is disposed.

The other power semiconductor device is a flip-chip MOSFET 42. Flip-chip MOSFET 42 includes a drain electrode 44 on one major surface, and source electrode 46 and gate electrode 48 on an opposing major surface thereof. Source electrode 46 is electrically connected to conductive pad 50, while gate electrode 48 is electrically connected to conductive pad 52. Conductive pad 50 and conductive pad 52 are disposed on substrate 39 and form part of circuit board 40. Optionally, a schottky diode (not shown) is connected in parallel with flip-chip 42 between the output node and the ground in order to minimize losses during dead time conduction.

As schematically shown in FIG. 3, the half-bridge circuit is implemented by directly connecting source contact 32 of MOSFET 30 to drain contact 44 of flip-chip MOSFET 42 to obtain the series connection shown by FIG. 1. In the preferred configuration shown by FIG. 3, conductive pad 38 serves as the input connection Vin, while conductive pad 50 serves as the ground connection. The output connection Vout in the preferred embodiment is a point between source contact 32 of MOSFET 30 and drain contact 44 of flip-chip MOSFET 42.

Figure 4:
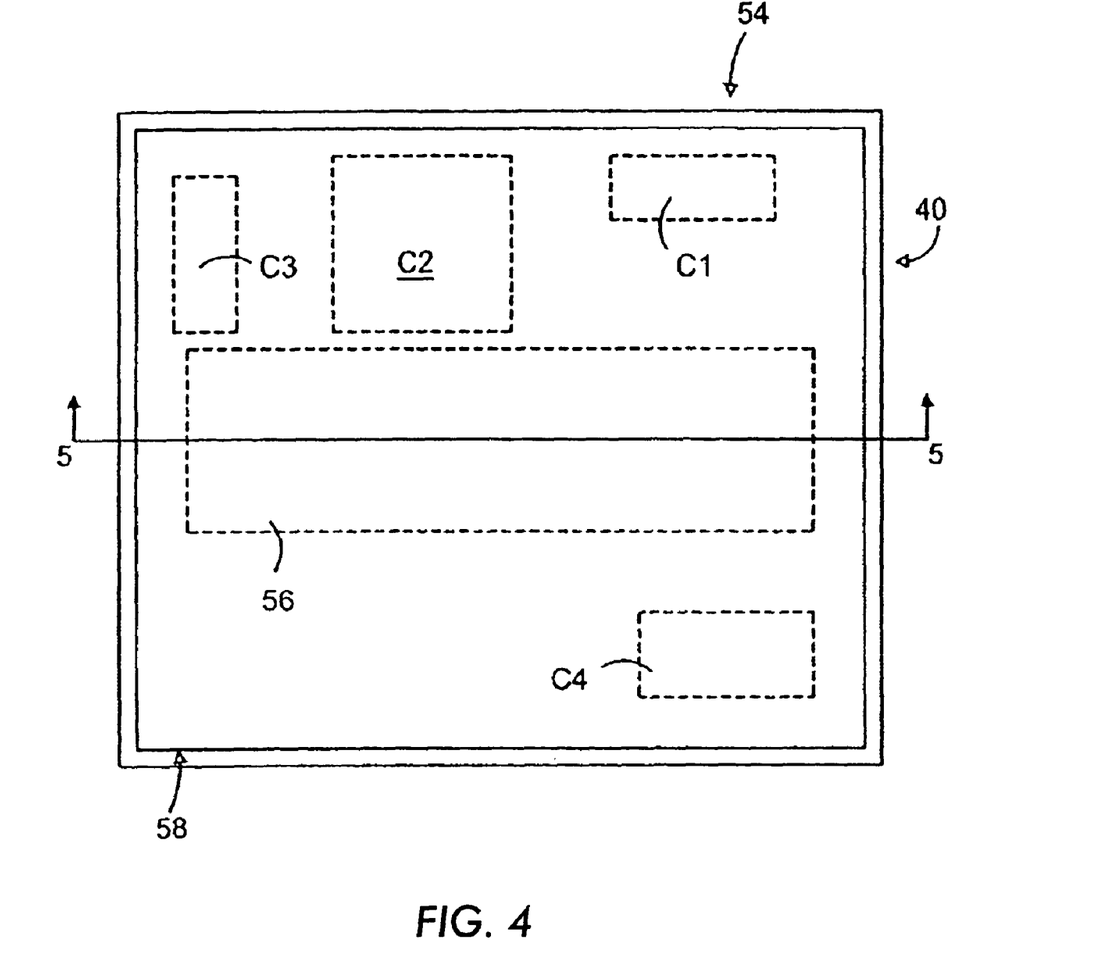
FIG. 4 shows a top plan view of an MCM layout according to a known configuration.

FIG. 4 shows the top plan view of an MCM 54. MCM 54 includes a printed circuit board 40 on which a plurality of components $C_1$, $C_2$, $C_3$, $C_4$ are disposed. MCM 54 also includes conductive element 56. Conductive element 56 serves to connect a power semiconductor device, such as a conventional MOSFET 30 (FIG. 3), to a flip-chip semiconductor device such as flip-chip MOSFET 42 (FIG. 3), and also serves as the output connection according to the arrangement shown in FIG. 3. As is conventionally known, a molded housing 58 encapsulates all of the components disposed on circuit board 40. The circuit formed on circuit board 40 may be connected to external components via external leads (not shown) which may be disposed anywhere outside of the molded housing 58. For example, external leads may be disposed on the edges of MCM 54 or on the bottom surface of circuit board 40 in a ball grid array (BGA) or land array format.

Figure 5:
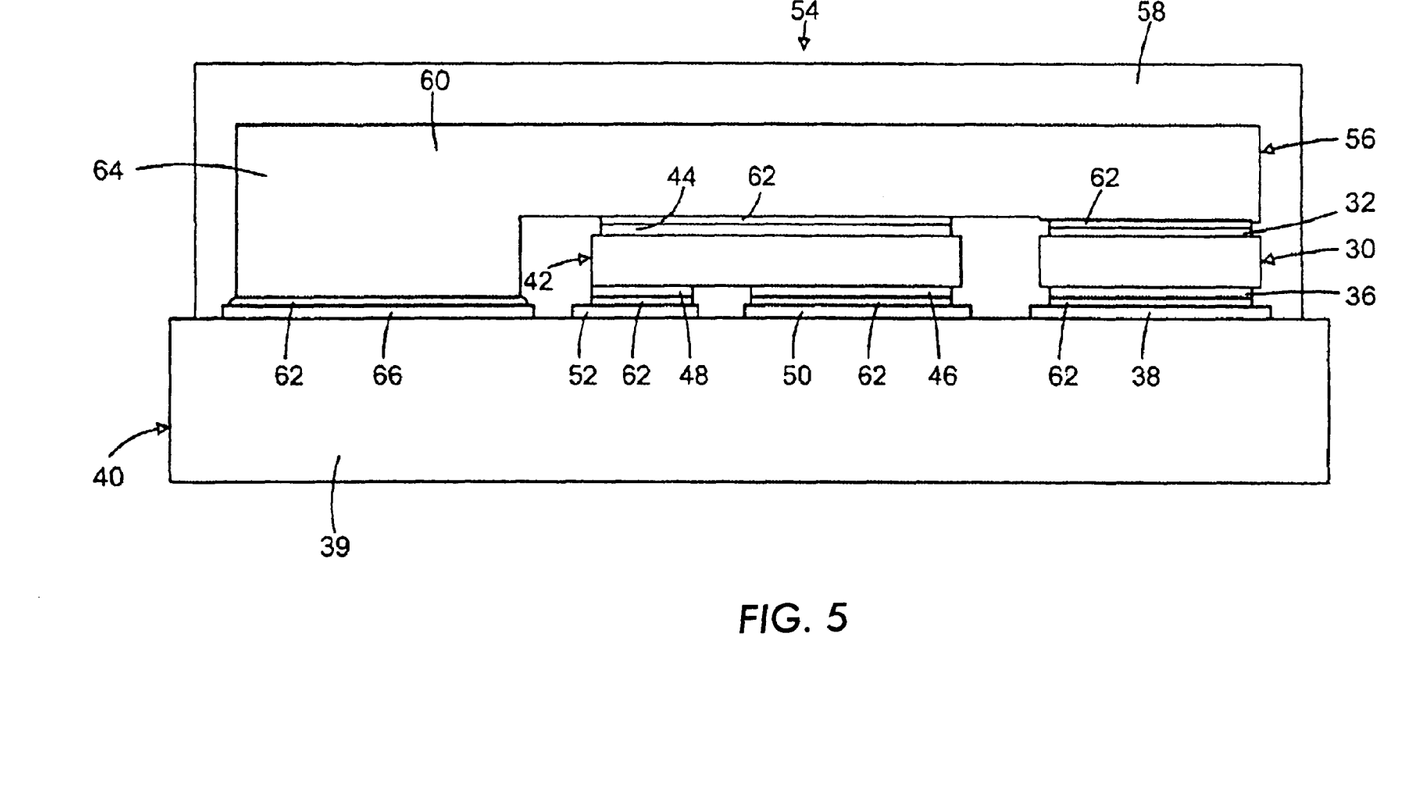
FIG. 5 shows a cross-sectional view of an MCM viewed along line 5-5 in FIG. 4 looking in the direction of the arrows.

FIG. 5 shows a cross-sectional view of MCM 54 along line 5-5 looking in the direction of the arrows. As seen in FIG. 5, MCM 54 includes conductive element 56. Conductive element 56 includes web portion 60 which connects drain contact 44 of flip-chip MOSFET 42 to source contact 32 of conventional MOSFET 30. As described before with reference to FIG. 3, source contact 46 of flip-chip MOSFET 42 is electrically connected to conductive pad 50 by a conductive layer 62 such as solder or conductive epoxy. Similarly, gate contact 48 of flip-chip MOSFET 42 is electrically connected to conductive pad 52 by a conductive layer 62. Drain contact 36 of conventional MOSFET 30 is also electrically connected to conductive pad 38 by a conductive layer 62.

Conductive element 56 also includes connector 64 which extends from an end thereof, and is electrically connected to conductive pad 66 by conductive layer 62. Web portion 60 and connector 64 are integral with one another.

In an MCM, conductive pad 66 serves as the output Vout (FIG. 3) of the half-bridge circuit, while conductive pad 50 and conductive pad 38 are connected to the ground and input Vin (FIG. 3) respectively.

In an MCM as described above, conductive element 56 is a relatively large metal body, which may be susceptible to solder joint fatigue and connector surface delamination.

SUMMARY OF THE INVENTION

To prevent or hinder damage due to solder joint fatigue which may result in the delamination of the connector from the die or the conductive pad an MCM according to the present invention includes features to strengthen the mechanical coupling between the conductive element and the semiconductor die.

In an MCM according to one embodiment of the present invention the connector portion of the conductive element includes at least one projection which is received and held in an opening in, for example, the conductive pad to which the connector is mechanically and electrically coupled. As a result, the conductive element is locked in place which can hinder delamination due, for example, to solder fatigue.

In other embodiments, recesses or the like are provided in the conductive element to improve mechanical coupling between the molded housing and the conductive element, thus hindering delamination.

Other features and advantages of the present invention will become apparent from the following description of the invention which refers to the accompanying drawings.

DETAILED DESCRIPTION OF EMBODIMENTS OF THE EMBODIMENTS

Figure 6:
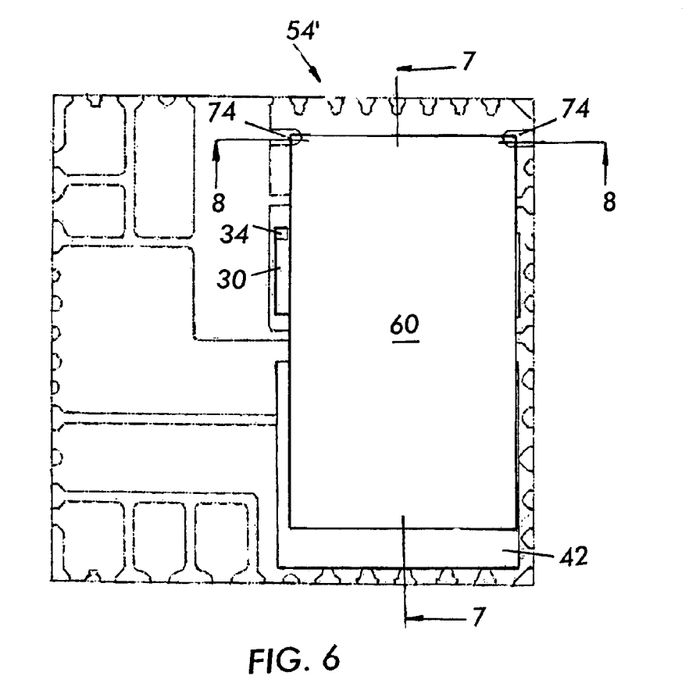
FIG. 6 illustrates a top plan view of an MCM (housing rendered transparent for better illustration) according to the first embodiment of the present invention.
Figure 7:
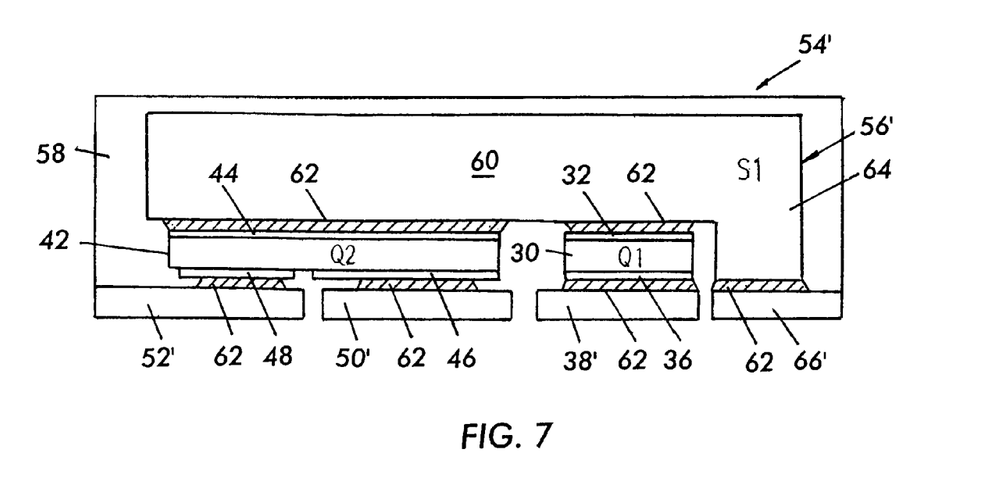
FIG. 7 illustrates a cross-sectional view of the MCM shown in FIG. 6 along line 7-7 viewed in the direction of the arrows.
Figure 8:
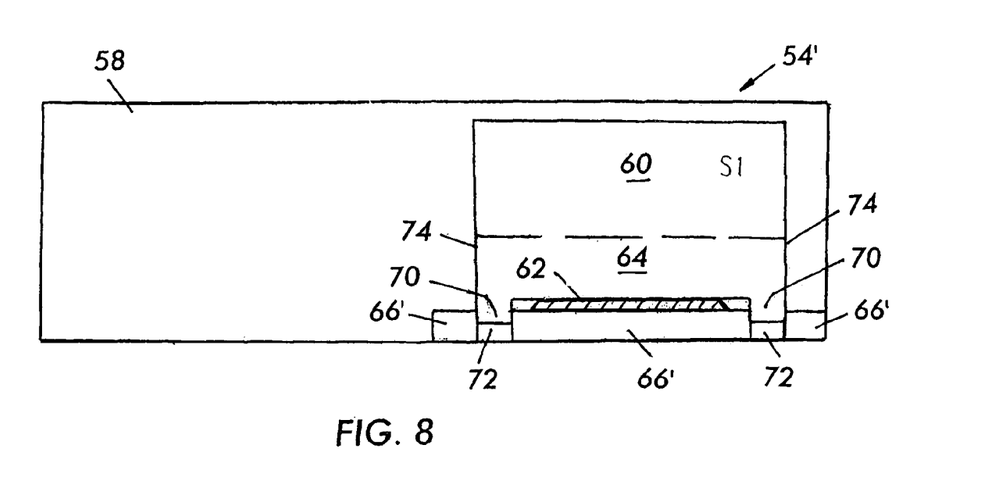
FIG. 8 illustrates a cross-sectional view of the MCM shown in FIG. 6 along line 8-8 viewed in the direction of the arrows.

Referring first to FIGS. 6, 7, and 8, an MCM according to an embodiment of the present invention includes a half-bridge circuit which is implemented by a pair of series connected power semiconductor devices one of which is a conventional device and the other one a flip-chip. According to the preferred embodiment of the present invention, the first one of the power semiconductor devices is a conventional vertical conduction power MOSFET 30 which has disposed on a first major surface thereof source contact 32 and gate contact 34, and on the opposing second major surface thereof drain contact 36. Drain contact 36 of power MOSFET 30 is electrically connected to conductive pad 38', by, for example, a layer of solder, or conductive epoxy. Conductive pad 38' is part of a lead frame or may be part of a circuit board such as an IMS, a DBC or an organic laminate substrate.

According to an aspect of the present invention, the other power semiconductor device in an MCM according to the present invention is a flip-chip MOSFET 42. Flip-chip MOSFET 42 includes a drain electrode 44 on one major surface, and source electrode 46 and gate electrode 48 on an opposing major surface thereof. Source electrode 46 is electrically connected to conductive pad 50', while gate electrode 48 is electrically connected to conductive pad 52'. Conductive pad 50' and conductive pad 52' are also part of the lead frame, or may be part of a circuit board such as an IMS, a DBC, or an organic laminate substrate. Optionally, a schottky diode (not shown) is connected in parallel with flip-chip 42 between the output node and the ground in order to minimize losses during dead time conduction.

The half-bridge circuit according to the present invention is implemented by directly connecting source contact 32 of MOSFET 30 to drain contact 44 of flip-chip MOSFET 42 to obtain the series connection shown by FIG. 1. In the preferred configuration, conductive pad 38' serves as the input connection Vin, while conductive pad 50' serves as the ground connection. The output connection Vout in the preferred embodiment is a point between source contact 32 of MOSFET 30 and drain contact 44 of flip-chip MOSFET 42. In the preferred application, MOSFET 42 is a synchronous rectifier while MOSFET 30 is a control switch for a buck converter.

According to an aspect of the present invention, MCM 54' also includes a conductive element 56'. Conductive element 56' serves to connect a power semiconductor device, such as a conventional MOSFET 30 (FIG. 3), to a flip-chip semiconductor device; such as flip-chip MOSFET 42 (FIG. 3), and also serves as the output connection according to the arrangement shown in FIG. 3. As is conventionally known, a molded housing 58 encapsulates all of the components disposed on the lead frame.

Conductive element 56' includes web portion 60 which connects drain contact 44 of flip-chip MOSFET 42 to source contact 32 of conventional MOSFET 30. As described before, source contact 46 of flip-chip MOSFET 42 is electrically connected to conductive pad 50' by a conductive adhesive layer 62 such as solder or conductive epoxy. Similarly, gate contact 48 of flip-chip MOSFET 42 is electrically connected to conductive pad 52' by a conductive adhesive layer 62. Drain contact 36 of conventional MOSFET 30 is also electrically connected to conductive pad 38' by a conductive adhesive layer 62.

Conductive element 56' also includes connector 64 which extends from an end thereof, and is electrically connected to conductive pad 66' by conductive adhesive layer 62. Web portion 60 and connector 64 are integral with one another, and in the preferred embodiment of the present invention form a unitary body.

In an MCM according to the present invention conductive pad 66' serves as the output Vout (FIG. 3) of the half-bridge circuit, while conductive pad 50' and conductive pad 38' are connected to the ground and input Vin (FIG. 3) respectively.

According to one aspect of the present invention, connector 64 includes at least one projection 70 that extends from the connection surface (surface connected to conductive pad 66') and is received in a corresponding opening 72 in pad 66'. Opening 72 may extend through pad 66' and is large enough to receive and hold projection 70. Specifically, opening 72 may be large enough so that the exterior surfaces of projection 70 make contact and frictionally engage the surfaces of opening 72 whereby projection 70 'locks' connector 64 to pad 66'.

In the first embodiment of the present invention as illustrated by FIGS. 6-8, connector 64 includes two spaced projections 70 each disposed at an opposing edge 74 of connector 64. Each projection 70 is received in a respective opening 72 in conductive pad 66' in the manner described above to lock connector 64.

Figure 9:
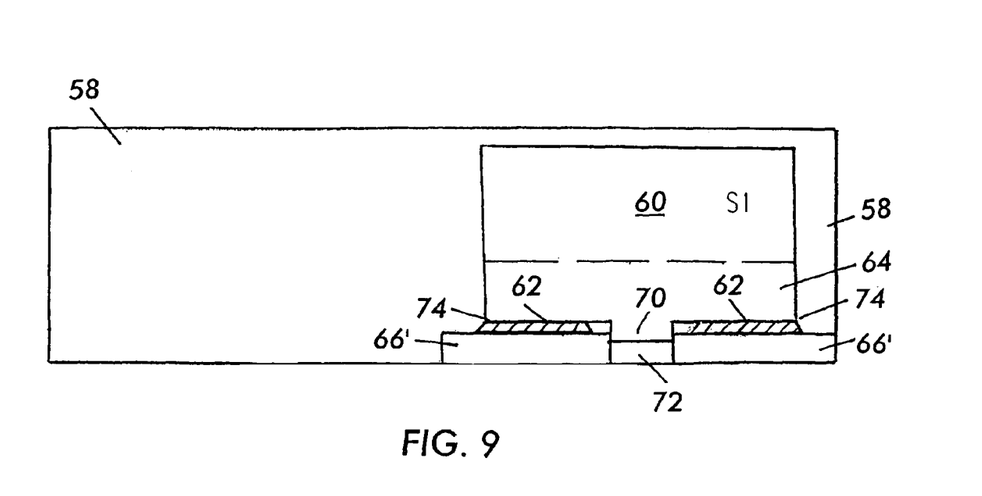
FIG. 9 illustrates a cross-sectional view of an MCM according to the second embodiment of the present invention.

Referring to FIG. 9, in a second embodiment of the present invention, one projection 70 extends from the connection surface of connector 64 and is received in a corresponding opening 72 in conductive pad 66'. In the second embodiment, projection 70 is located at a terminal edge of connector 64 between two opposing parallel edges 74.

Figure 10:
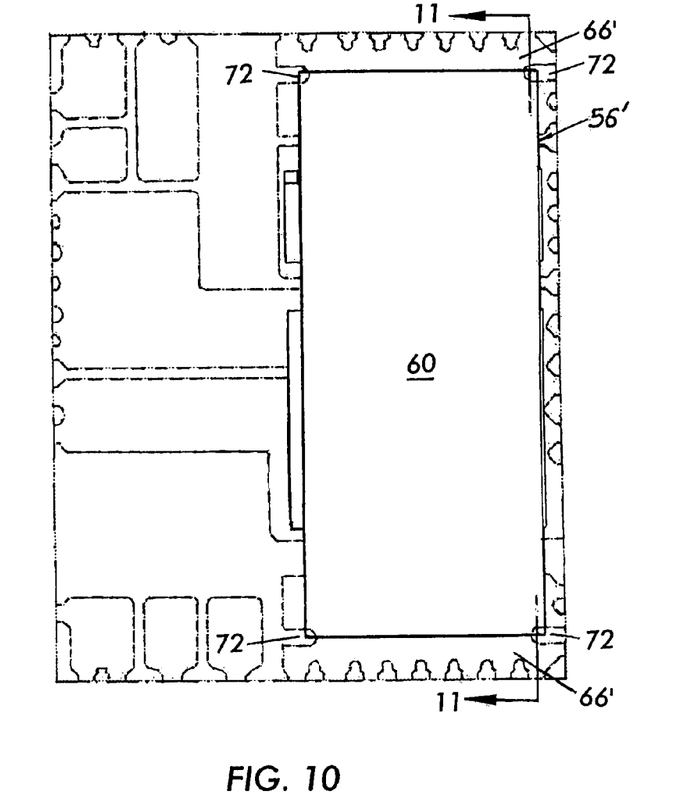
FIG. 10 illustrates a top plan view of an MCM (housing rendered transparent for better illustration) according to the third embodiment of the present invention.
Figure 11:
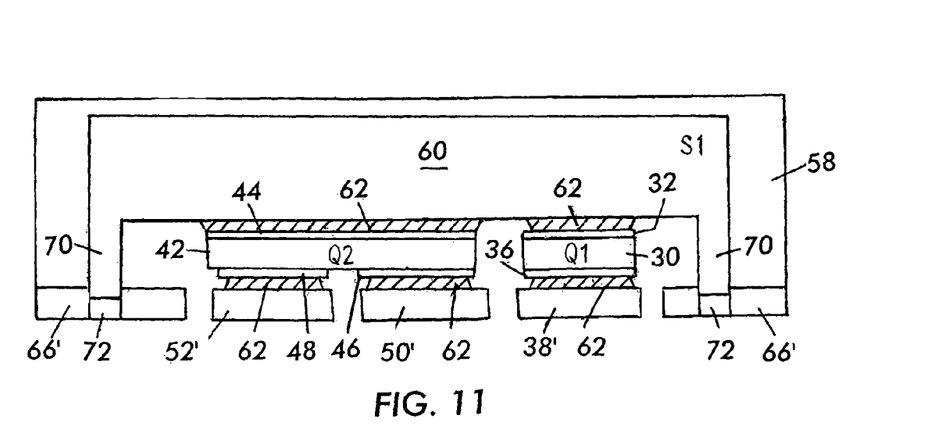
FIG. 11 illustrates a cross-sectional view of the MCM shown in FIG. 10 along line 11-11 viewed in the direction of the arrows.

Referring now to FIGS. 10 and 11, in which like numerals identify like features, in an MCM according to the third embodiment of the present invention, conductive element 56' includes two connectors 64 each disposed at an opposite end of web portion 60 of conductive element 56'. Each connector 64 includes at least one projection 70 received in a corresponding opening in a conductive pad 66' in the manner described above whereby conductive element 56' is locked in place. Preferably, each connector 64 in the third embodiment includes two projections 70 each disposed at an opposing edge thereof, and each received in a corresponding opening 72 in a conductive pad 66'.

Figure 12:
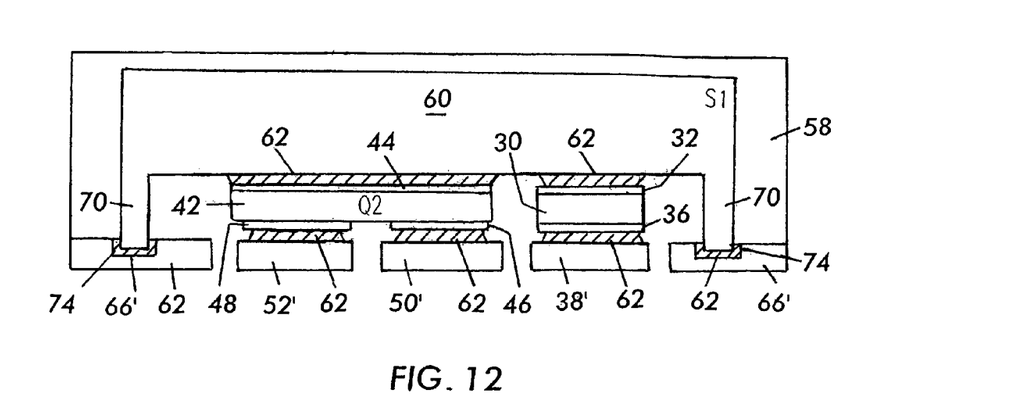
FIG. 12 illustrates an MCM according to the fourth embodiment of the present invention.

Referring now to FIG. 12, in which like numerals identify like features, in an MCM according to the fourth embodiment of the present invention, each projection 70 is received in a recess or groove 74 (i.e. an opening having a closed end) rather than a through opening 72 and locked in place in the manner described above. Each recess or groove 74 may be formed by etching partially through a conductive pad 66'. Note that optionally, as shown, a conductive adhesive body 62 may be used to adhesively attach the bottom surface of each projection 70 to the bottom surface of a corresponding recess or groove 74.

Figure 13:
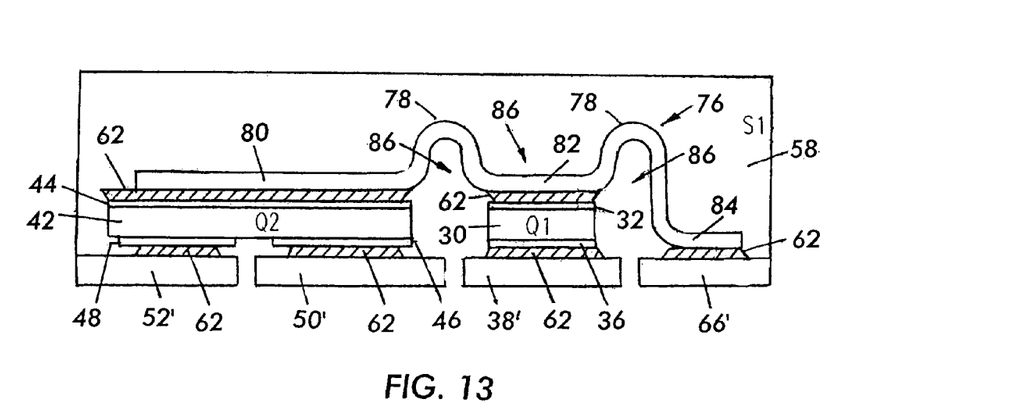
FIG. 13 illustrates an MCM according to the fifth embodiment of the present invention.

Referring now to FIG. 13, in which like numerals indicating like features, in a MCM according to the fifth embodiment, conductive element 56' is replaced with a strap 76. Strap 76 includes at least one kink 78, and preferably two kinks 78, a first portion 80 electrically and mechanically connected to drain electrode 44 through an adhesive body 62, second portion 82 electrically and mechanically connected to source electrode 32 through an adhesive body 62, and a third portion 84 electrically and mechanically coupled to conductive pad 66'. As seen, one kink 78 is disposed between first and second portions 80, 82, and the other kink 78 is disposed between second and third portions 82, 84. Each kink 78 bulges away from MOSFETs 30, 44 and thus creates spaces 86 in which mold compound 58 is received, whereby strap 76 is further secured against delamination due to improved mechanical coupling between strap 76 and molded housing 58. Kinks 78 can also help to release the thermo-mechanical stress of the package.

Figure 14:
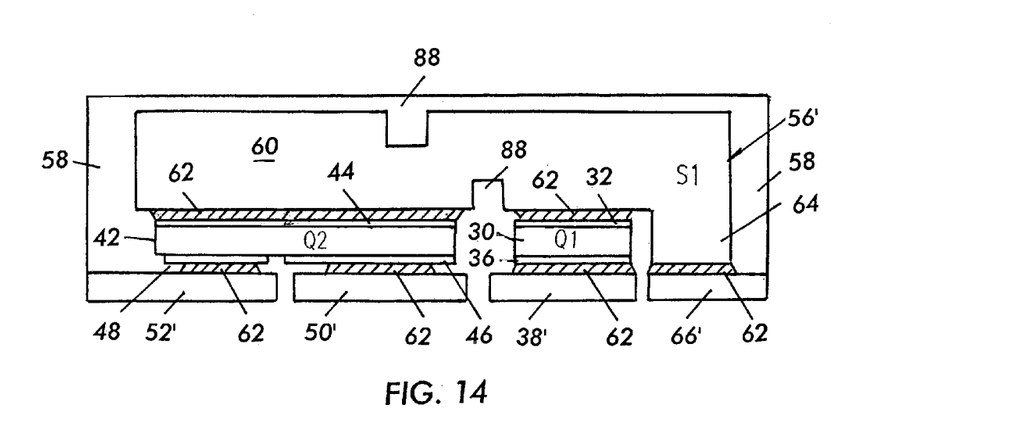
FIG. 14 illustrates an MCM according to the sixth embodiment of the present invention.

Referring now to FIG. 14, in which like numerals identify like features, in an MCM according to the sixth embodiment, conductive element 56' includes two recesses or slots 88 running transverse to the length of web 60 and disposed on opposite sides of web 60. One slot is disposed at the surface connected to MOSFETs 42, 30 and therebetween, and another at the surface opposite the surface connected to MOSFETs 42, 30. Each slot 88 receives mold compound 58 and thus acts to enhance the coupling between web 60 and molded housing 58, thereby hindering delamination and releasing stress.

Figure 15:
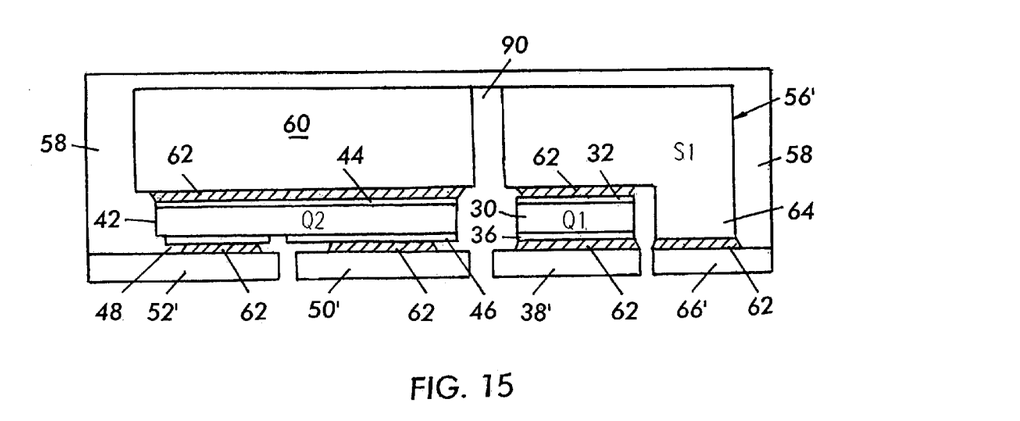
FIG. 15 illustrates an MCM according to the seventh embodiment of the present invention.

Referring now to FIG. 15, in which like numerals identify like features, in an MCM according to the seventh embodiment of the present invention, web 60 includes a through hole 90 therein, preferably disposed at a location between MOSFETs 42, 30. Hole 90 receives in the interior thereof mold compound 58, which enhances mechanical coupling between molded housing 58 and web 60. As a result, delamination may be hindered.

Figure 16:
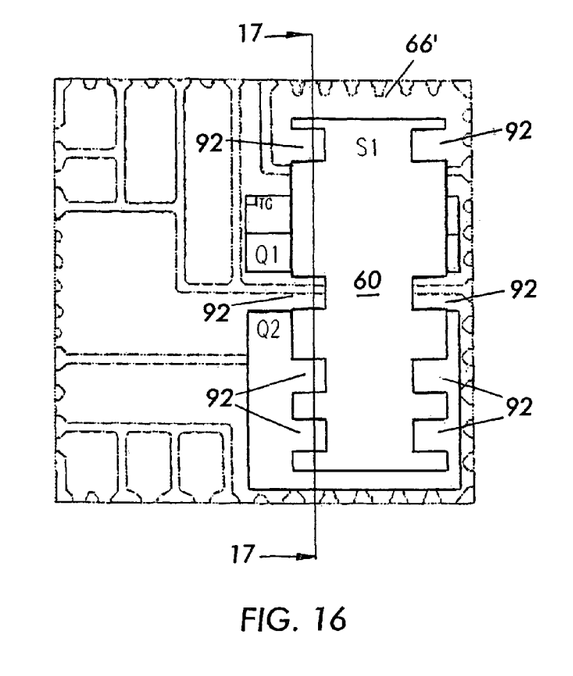
FIG. 16 illustrates a top plan view of an MCM (housing rendered transparent for better illustration) according to the eighth embodiment of the present invention.
Figure 17:
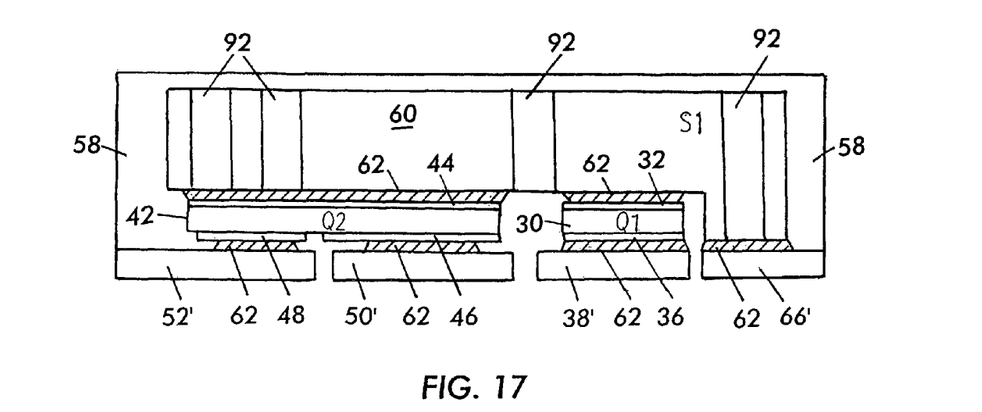
FIG. 17 illustrates a cross-sectional view of the MCM shown in FIG. 16 along line 17-17 viewed in the direction of the arrows.

Referring now to FIGS. 16 and 17, in which like numerals identify like features, in an MCM according to the eighth embodiment of the present invention, web 60 and connector 64 of conductive element 56' each includes a plurality of channels or slots 92 each running the full thickness of a side thereof. Preferably, slots 92 are provided on opposite sides (each side being transverse to the surface that is connected to die 42, 30) of conductive element 56'. Each slot 92 receives in the interior thereof mold compound 58 thereby enhancing the mechanical coupling between molded housing 58 and element 56' to hinder delamination.

Figure 18:
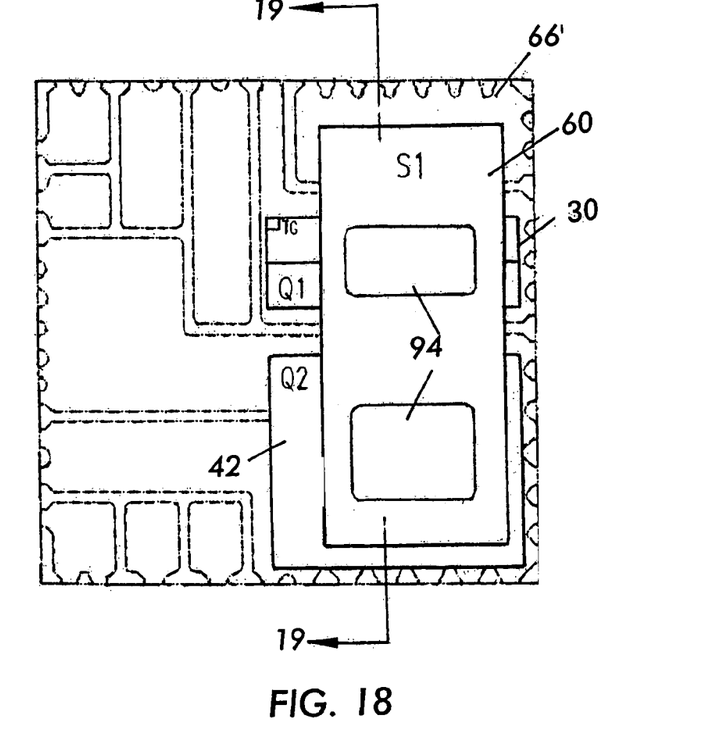
FIG. 18 illustrates a top plan view of an MCM (housing rendered transparent) according to the ninth embodiment of the present invention.
Figure 19:
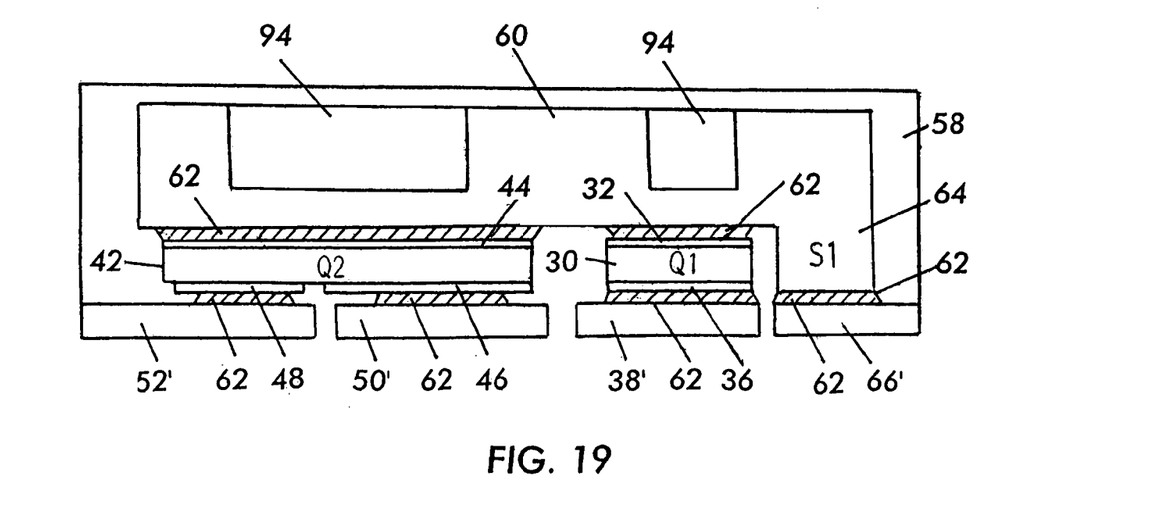
FIG. 19 illustrates a cross-sectional view of the MCM shown in FIG. 18 along line 19-19 viewed in the direction of the arrows.

Referring now to FIGS. 18 and 19, in which like numerals identify like features, in an MCM according to the ninth embodiment of the present invention, web 60 includes at least one, but preferably two or more depressions 94 formed therein. Unlike the previous embodiments each depression 94 does not cut all the way through web 60, but is surrounded by the body of conductive element 56'. Each depression 94 receives mold compound 58 in the interior space thereof which enhances mechanical coupling between web 60 and molded housing 58, thereby hindering delamination.

It should be noted that instead of a lead frame conductive pads formed on a circuit board such as an insulated metal substrate (IMS), an organic laminate substrate, or a direct-bonded copper (DBC) can be used without deviating from the scope and the spirit of the present invention.

Preferably, conductive element 56' is a metallic body such as a body made from copper or a copper alloy, or a body plated with copper, nickel or a similar material that is thermally and electrically compatible with the die used in the MCM.

Furthermore, although in the preferred embodiment MOSFETs are used, an MCM according to the present invention may be devised with IGBTs, or compound semiconductor components (e.g. III-nitride based transistors).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A multi-chip module comprising:
a first conductive pad, a second conductive pad and a third conductive pad having an opening therein;
a conductive element, said conductive element including a web portion and a connector extending from a first major surface of said web portion and including a connection surface electrically and mechanically connected to said third conductive pad, said connector including a projection extending away from said connection surface of said connector and received in said opening; and
a first semiconductor die and a second semiconductor die, each semiconductor die having a first contact of a first designation disposed on a first major surface thereof and a second contact of a second designation disposed on a second opposing major surface thereof;
wherein said first contact of said first semiconductor die is electrically connected to said first conductive pad, said second contact of said second semiconductor die is connected to said second conductive pad, and said second contact of said first semiconductor die and said first contact of said second semiconductor die are connected to said first major surface of said web portion.

2. A multi-chip module according to claim 1, further comprising another opening in said third conductive pad and another projection extending from said connector and received in said another opening in said third conductive pad.

3. A multi-chip module according to claim 2, wherein said projection and said another projection are disposed at opposing edges of said connector.

4. A multi-chip module according to claim 1, wherein said semiconductor die are MOSFETs, said first contacts of which are source contacts and said second contacts or which are drain contacts.

5. A multi-chip module according to claim 1, wherein each or said semiconductor die is one of MOSFET, IGBT, or a compound semiconductor component.

6. A multi-chip module according to claim 1, wherein said conductive element includes another connector disposed opposite said connector, said another connector including a projection that is received in a respective opening in a conductive pad.

7. A multi-chip module comprising:
a plurality of conductive pads;
a plurality of semiconductor dies each electrically connected to at least one of the plurality of conductive pads; and
a conductive element, said conductive element including a web portion and a connector extending from a first major surface of said web portion and including a connection surface electrically and mechanically connected to one of said plurality of conductive pads having openings, said connector including a plurality of projections disposed at opposing edges of said connector and extending away from said connection surface of said connector and into said openings;
wherein said plurality of semiconductor dies are connected to said first major surface of said web portion.

8. A multi-chip module according to claim 7, wherein each of said plurality of semiconductor dies is one of MOSFET, IGBT, or a compound semiconductor component.

9. A multi-chip module according to claim 7, wherein said plurality of semiconductor dies are MOSFETs.

10. A multi-chip module according to claim 7, wherein said conductive element includes another connector disposed opposite said connector, said another connector including a plurality of projections disposed at opposing edges of said another connector that are received in respective openings in a conductive pad.

11. A multi-chip module according to claim 7, wherein said plurality of conductive pads are formed on one of an insulated metal substrate, an organic laminate substrate, or a direct-bonded copper substrate.

12. A multi-chip module according to claim 7, wherein said conductive element comprises a metallic body or copper or copper alloy.

13. A multi-chip module according to claim 7, wherein said conductive element is configured to be thermally and electrically compatible with said multi-chip module.

14. A multi-chip module comprising:
a plurality of conductive pads;
a plurality or semiconductor dies each electrically connected to at least one of the plurality of conductive pads;
a conductive element, said conductive element including a web portion and a connector extending from a first major surface of said web portion and including connection surface electrically and mechanically connected to one of said plurality of conductive pads having openings, said connector including a plurality of projections disposed at opposing edges of said connector and extending away from said connection surface of said connector and into said openings;
wherein said plurality of semiconductor dies are connected to said first major surface of said web portion; and
a molded housing enclosing said conductive element and said plurality of semiconductor dies.

15. A multi-chip module according to claim 14, wherein each of said plurality of semiconductor dies is one of MOSFET, IGBT, or a compound semiconductor component.

16. A multi-chip module according to claim 14, wherein said plurality of semiconductor dies are MOSFETs.

17. A multi-chip module according to claim 14, wherein said conductive element includes another connector disposed opposite said connector, said another connector including a plurality of projections disposed at opposing edges of said another connector that are received in respective openings in a conductive pad.

18. A multi-chip module according to claim 14, wherein said plurality of conductive pads are formed on one of an insulated metal substrate, an organic laminate substrate, or a direct-bonded copper substrate.

19. A multi-chip module according to claim 14, wherein said conductive element comprises a metallic body of copper or copper alloy.

20. A multi-chip module according to claim 14, wherein said conductive element is configured to be thermally and electrically compatible with said multi-chip module.

* * * * *

UNITED STATES PATENT AND TRADEMARK OFFICE
CERTIFICATE OF CORRECTION

PATENT NO. : 7,804,131 B2  Page 1 of 1
APPLICATION NO. : 11/796771
DATED : September 28, 2010
INVENTOR(S) : Cheah et al.

It is certified that error appears in the above-identified patent and that said Letters Patent is hereby corrected as shown below:

In the claims, column 7, line 39, "or said" should be changed to --of said--.

In the claims, column 8, line 28, --a-- should be inserted immediately before "connection".

Signed and Sealed this
Twenty-second Day of November, 2011

David J. Kappos
*Director of the United States Patent and Trademark Office*